(12) United States Patent
Ruth et al.

(10) Patent No.: US 12,276,234 B2
(45) Date of Patent: Apr. 15, 2025

(54) COMPONENT IDENTIFICATION CODING AND READING (71) Applicant: CUMMINS INC., Columbus, IN (US)

(72) Inventors: Michael J. Ruth, Franklin, IN (US); Michael Haas, Columbus, IN (US); Aaron William Beinborn, Columbus, IN (US); J. Steven Kolhouse, Columbus, IN (US)

(73) Assignee: Cummins Inc., Columbus, IN (US)

( * ) Notice: Subject to any disclaimer, the term of this patent is extended or adjusted under 35 U.S.C. 154(b) by 139 days.

(21) Appl. No.: 17/308,180

(22) Filed: May 5, 2021

(65) Prior Publication Data

US 2022/0356854 A1 Nov. 10, 2022

(51) Int. Cl.
*G01R 27/02* (2006.01)
*B23K 26/351* (2014.01)
(Continued)

(52) U.S. Cl.
CPC ........ *F02D 41/2432* (2013.01); *B23K 26/351* (2015.10); *F02D 41/2467* (2013.01);
(Continued)

(58) Field of Classification Search
CPC .. F02D 41/2432; F02D 41/2467; F02D 41/28; F02D 2041/283; F02D 41/2464;
(Continued)

(56) References Cited

U.S. PATENT DOCUMENTS

| 5,207,199 A | 5/1993 | Sekiguchi |
| 5,493,892 A * | 2/1996 | Sherman ................. G01F 25/10 |
| | | 73/1.42 |

(Continued)

FOREIGN PATENT DOCUMENTS

| CN | 110164641 A | * | 8/2019 |
| JP | 2001282743 A | * | 10/2001 |
| KR | 20120121119 | * | 11/2012 |

OTHER PUBLICATIONS

Extreme Networks, extreme-networks.my.site.com/ExtrArticleDetail?an=000070990, Jun. 23, 2016 (Year: 2016).*

(Continued)

*Primary Examiner* — Catherine T. Rastovski
*Assistant Examiner* — Yossef Korang-Beheshti
(74) *Attorney, Agent, or Firm* — Foley & Lardner LLP (57) ABSTRACT

A method of calibrating a control system based on a parametric value of a component. The method includes receiving a current from a component of the control system. The component is communicatively coupled to a controller and has a parametric resistor with a parametric resistance value correlating to a parametric value associated with the component. The method further includes determining the resistance value of the parametric resistor by measuring a parametric voltage rating from the current. The method further includes mapping the resistance value to the parametric value associated with the component. The method further includes generating a calibration data set. The calibration data set is based on calibrating the control system to calibrate for the parametric value. The method further includes transmitting a signal to the component. The signal is based on the calibration data set and is configured to calibrate operation of the component.

15 Claims, 6 Drawing Sheets

(51) Int. Cl.
*F02D 41/24* (2006.01)
*F02D 41/28* (2006.01)
*H01C 17/00* (2006.01)

(52) U.S. Cl.
CPC ............ *F02D 41/28* (2013.01); *G01R 27/02* (2013.01); *H01C 17/00* (2013.01); *F02D 2041/283* (2013.01)

(58) Field of Classification Search
CPC ...... B23K 26/351; B23K 26/03; B23K 26/62; G01R 27/02; H01C 17/00
See application file for complete search history.

(56) References Cited

U.S. PATENT DOCUMENTS

| | | | |
|---|---|---|---|
| 6,651,629 B2 | 11/2003 | McCoy | |
| 6,671,611 B1 | 12/2003 | Peltier | |
| 7,253,539 B2 | 8/2007 | Bolz | |
| 9,284,905 B2 | 3/2016 | Jung | |
| 9,840,981 B2 | 12/2017 | Brandt et al. | |
| 2004/0124850 A1* | 7/2004 | Koneru | G01R 35/005 324/601 |
| 2008/0122425 A1* | 5/2008 | Ernest | H05G 1/265 324/72 |
| 2014/0135948 A1* | 5/2014 | Kanzaki | G05B 19/0426 700/54 |
| 2018/0149692 A1* | 5/2018 | Frampton | G01R 31/44 |
| 2019/0010619 A1* | 1/2019 | Nourbakhsh | C25B 1/26 |

OTHER PUBLICATIONS

"Mel 40 Laser Resistor Trimming Station," retrieved from https://www.youtube.com/watch?v=KGDolxquOAg, 3 pages (2011).

Gu, et al., "Advanced resistor trimming," Industrial Laser Solutions, retrieved from https://www.industrial-lasers.com/micromachining/article/16490096/advanced-resistor-trimming, 14 pages (2007).

* cited by examiner

COMPONENT IDENTIFICATION CODING AND READING

TECHNICAL FIELD

The present disclosure relates generally to coding components used in a controllable mechanical system.

BACKGROUND

A component, such as a component for an engine, inherently includes some part-to-part variation compared to a model component. This variation may be a result of manufacturing and assembly tolerances of the components. Variation may also be a result of components being manufactured by different suppliers. While it may be possible for components to include embedded software to self-calibrate their performance to compensate for their variation, such a system may be expensive and difficult to service.

Additionally, in an effort to reduce nitrogen oxide ($NO_x$) and greenhouse gases, emission regulations have become more stringent over recent years. In engines, increasing efficiency is one approach to reducing harmful emissions. However, part-to-part variation of engine components can result in decreased engine efficiency.

SUMMARY

One embodiment relates to a method of calibrating a control system by a controller based on a parametric value of a component. The method includes receiving a current from a component of the control system. The component is communicatively coupled to the controller and has a parametric resistor with a parametric resistance value correlating to a parametric value associated with the component. The method further includes determining the resistance value of the parametric resistor by measuring a parametric voltage rating from the current. The method further includes mapping the resistance value to the parametric value associated with the component. The method further includes generating a calibration data set. The calibration data set is based on calibrating the control system to calibrate for the parametric value. The method further includes transmitting a signal to the component. The signal is based on the calibration data set and is configured to calibrate operation of the component.

Another embodiment relates to a method of manufacturing a component by a laser etching machine. The method includes determining a parametric value of a component. The method further includes, mapping the parametric value to a resistance value. The method further includes, laser etching a resistor having the resistance value onto the component.

In yet another embodiment relates to a system. The system includes a fuel injector including a parametric resistor. The system further includes a controller coupled to the fuel injector. The controller is configured to measure a resistance value of the parametric resistor. The controller is further configured to map the resistance value to a flow biasing value associated with the fuel injector. The flow biasing value is an amount of fuel dispensed by the fuel injector. The controller is further configured to determine a dispensing time of the fuel injector based on the flow biasing value.

BRIEF DESCRIPTION OF THE DRAWINGS

The details of one or more implementations are set forth in the accompanying drawings and the description below.

Other features, aspects, and advantages of the disclosure will become apparent from the description, the drawings, and the claims, in which:

It will be recognized that the figures are schematic representations for purposes of illustration. The figures are provided for the purpose of illustrating one or more implementations with the explicit understanding that the figures will not be used to limit the scope or the meaning of the claims.

DETAILED DESCRIPTION

Following below are more detailed descriptions of various concepts related to, and implementations of, methods, apparatuses, and systems for coded components for identification. The methods, apparatuses, and systems introduced above and discussed in greater detail below may be implemented in various ways, as the described concepts are not limited to any particular manner of implementation. Examples of specific implementations and applications are provided primarily for illustrative purposes.

Figure 1:
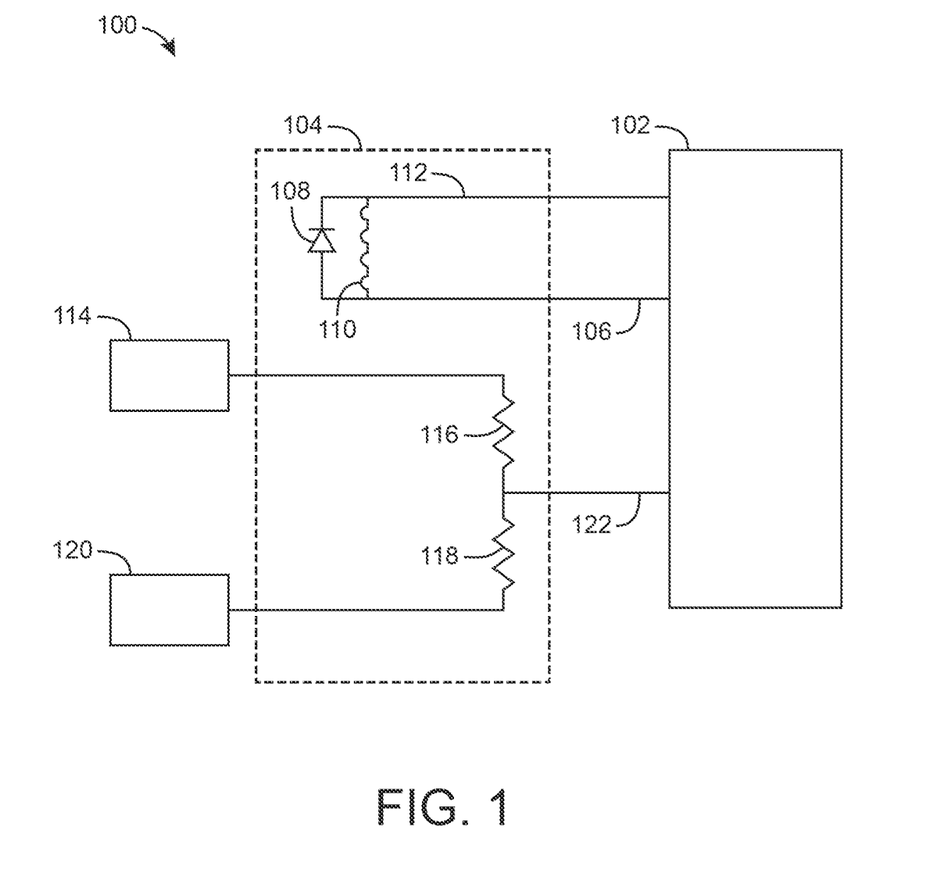
FIG. 1 is a block schematic of an example control system.

FIG. 1 is a block schematic of a control system 100. The control system 100 can be utilized in any mechanical system having electronic controls. In some embodiments, the control system 100 is utilized in a vehicle with an internal combustion engine. In various embodiments, the control system 100 is utilized in an exhaust aftertreatment system, a fluid control system, a turbine system, or a transmission system. The control system 100 is configured to read a resistance value of a parametric component. The resistance value correlates to a parametric value of the parametric component. The control system 100 is configured to provide an initial calibration factor for the operation of the parametric component based on the parametric value. In some embodiments, the control system 100 is configured to calibrate other components of the control system 100 based on the parametric value of the parametric component.

The control system 100 includes a controller 102. As discussed in greater detail herein, the controller 102 is configured to communicate with any and/or all of the parametric components in the control system 100. In various embodiments, the controller 102 is configured to communicate with a central controller (e.g., engine control unit (ECU), engine control module (ECM)) of the control system 100). In some embodiments, the controller 102 and the central controller are integrated into a single controller.

The control system 100 further includes a parametric component 104 (e.g., target components such as fuel injectors, actuators, turbines, rack-and-pinions, valves, throttles, exhaust gas recirculation (EGR) systems, variable geometry turbochargers (VGT), EGR bypass valves, cold air charger (CAC) bypass valves, injectors, glow plugs, grid heaters, fuel pumps, metering valves, lift pumps, alternators, generators, ignition system components, spark plugs, intake throttles, exhaust throttles, variable valve timing phasers, variable valve actuator phasers, actuators associated with cylinder deactivation, thermostats, fuel pump metering valves, urea injectors, urea pumps, starter motors, aftertreatment dosers, aftertreatment doser pumps, aftertreatment reductant delivery, hydrocarbon dosers, aftertreatment injectors, exhaust heaters, hybrid motors, hybrid generators, hybrid batteries, electric axles (eAxle), electric pumps, electric fans, etc.).

The parametric component 104 is electronically coupled to the controller 102. The operation of the parametric component 104 is controlled by the controller 102. For example, when the parametric component 104 is a fuel injector, the controller 102 determines the duration that the fuel injector dispenses fuel into an engine cylinder.

The control system 100 includes a first electronic conduit 106 (e.g., electric wire, powered cable, etc.). The parametric component 104 is electronically coupled to the controller 102 via the first electronic conduit 106. The controller 102 controls the operation of the parametric component 104 via the first electronic conduit 106 by transmitting electricity from the controller 102 to the parametric component 104. The parametric component 104 receives a positive or negative charge from the controller 102 through the first electronic conduit 106. In alternative embodiments, the controller 102 is communicatively coupled to the first electronic conduit 106 wirelessly (e.g., Bluetooth, Near-Field Communication, internet, intranet, etc.).

In some embodiments, the parametric component 104 includes a diode 108. The diode 108 facilitates current to flow through the diode 108 in a single direction. When the direction of the current flow is reversed (e.g., opposite polarity), the diode 108 blocks current flow. The parametric component 104 also includes an inductor 110. When the direction of the current flow is reversed (e.g., such that current does not flow through the diode 108), current then flows through the inductor 110. As current begins to flow through the inductor 110, the rate of the current (e.g., the ampere of the current) passing through the inductor 110 also increases. In these embodiments, the controller 102 provides a reverse power supply (e.g., the reverse power orientation as compared to the typical operation of the parametric component 104) to the parametric component 104. Accordingly, the diode 108 blocks the current flow, resulting in the current to flow through the inductor 110. The current passing through the inductor 110 is then returned to the controller 102. The controller 102 is configured to determine a resistance value of a resistor in the parametric component 104 by measuring the received current. As discussed in greater detail herein, the controller 102 then determines parameters of the parametric component 104 after receiving and measuring the resistance value of the resistor. These embodiments are advantageous as it reduces the need for additional components to measure the resistance value of the resistor.

The diode 108 and the inductor 110 are utilized together so that the control system 100 controls the operation of the parametric component 104. For example, when the parametric component 104 is a fuel injector, the duration the fuel injector dispenses fuel is controlled by the controller 102, which adjusts the direction of the current flow to the diode 108 and the inductor 110.

The control system 100 includes a second electronic conduit 112 (e.g., electric wire, powered cable, etc.). The parametric component 104 is electronically coupled to the controller 102 via the second electronic conduit 112. This provides the control system 100 additional control of the operation of the parametric component 104 via the second electronic conduit 112. The parametric component 104 receives a positive or negative charge from the controller 102 through the second electronic conduit 112. In alternative embodiments, the controller 102 is communicatively coupled the second electronic conduit 112 wirelessly (e.g., Bluetooth, Near-Field Communication, internet, intranet, etc.).

The control system 100 also includes a voltage source 114 (e.g., battery, power source) that provides power to the control system 100. The power provided by the voltage source 114 has a voltage rating known by the controller 102, which facilitates the controller 102 determining the characteristics of the other circuitry elements in the parametric component 104.

The parametric component 104 also includes a parametric resistor 116. The parametric resistor 116 may be laser etched onto a thin film (e.g., resistor film) on an exterior surface or an interior surface of the parametric component 104. In some embodiments, the thin film is located on the internal circuitry of the parametric resistor 116. The resistance range of the parametric resistor 116 is dependent on the size of the parametric resistor 116, the shape geometry of the parametric resistor 116, and the thin film material.

When the parametric component 104 is a fuel injector, the fuel injector may be tested to determine attributes for that specific parametric component 104. If during testing it is determined that the fuel injector is biased to produce a high fuel flow (e.g., it dispenses more fuel flow during operation than the nominal fuel injector), the resistance value of the parametric resistor 116 may be etched onto the exterior surface of the fuel injector correlating to the amount of fuel flow produced by that fuel injector. In some embodiments, the parametric resistor 116 is laser etched onto thin film during the manufacturing of the parametric component 104.

In another example, when the parametric component 104 is a valve, the resistance of the parametric resistor 116 may correlate to the manufacturer of the valve. In this example, a manufacturer produces valves having a slower electronic response rate. Accordingly, after determining the parametric resistance for that valve, the control system 100 may provide an earlier command to the valve to calibrate for the slower electronic response rate. This configuration is advantageous as it eliminates human intervention to specify which valve is installed into a control system. In another embodiment, the resistance of the parametric resistor 116 may correlate to a make and/or model of parametric component 104.

The resistance of the parametric resistor 116 may correlate to the capabilities (e.g., specifications, etc.) of the parametric component 104. For example, when the parametric component 104 is an ERG valve, the resistance of the parametric resistor 116 may correlate to a number of teeth of the EGR valve.

The parametric component 104 also includes a known resistor 118. The known resistor 118 has a known resistance value. After interfacing with the parametric resistor 116, a portion of the current interfaces with the known resistor 118. That portion of the current flows into a ground source 120. The ground source 120 provides a ground for the circuit in the parametric component 104. The known resistor 118 and the voltage source 114 have known values so that the controller can determine the values of other circuitry components.

The control system 100 also includes a third electronic conduit 122 (e.g., electric wire, powered cable, etc.). The parametric component 104 is electronically coupled and/or communicatively coupled to the controller 102 via the third electronic conduit 122. The third electronic conduit 122 provides current to the controller 102 after interfacing with the parametric resistor 116 and the known resistor 118. In various embodiments, the controller 102 is coupled the third electronic conduit 122 wirelessly (e.g., Bluetooth, Near-Field Communication, internet, intranet, etc.).

The controller 102 reads the voltage rating transmitted via the third electronic conduit 122. As the voltage supplied by the voltage source 114 and the resistance value of the known resistor 118 are known, the controller 102 then calculates (e.g., determines) the resistance value of the parametric resistor 116 using the voltage divider equation 1.

$$V_{Reading} = V_{Source} \frac{R_{Known}}{R_{Parameter} + R_{Known}} \quad (1)$$

As discussed in greater detail herein, the controller 102 maps the resistance value of the parametric resistor 116 to a known parametric value. The control system 100 calibrates the performance of the parametric component 104 based on the known parametric value. In some embodiments, the controller 102 maps the voltage rating transmitted via the third electronic conduit 122 to the parametric value.

Figure 2:
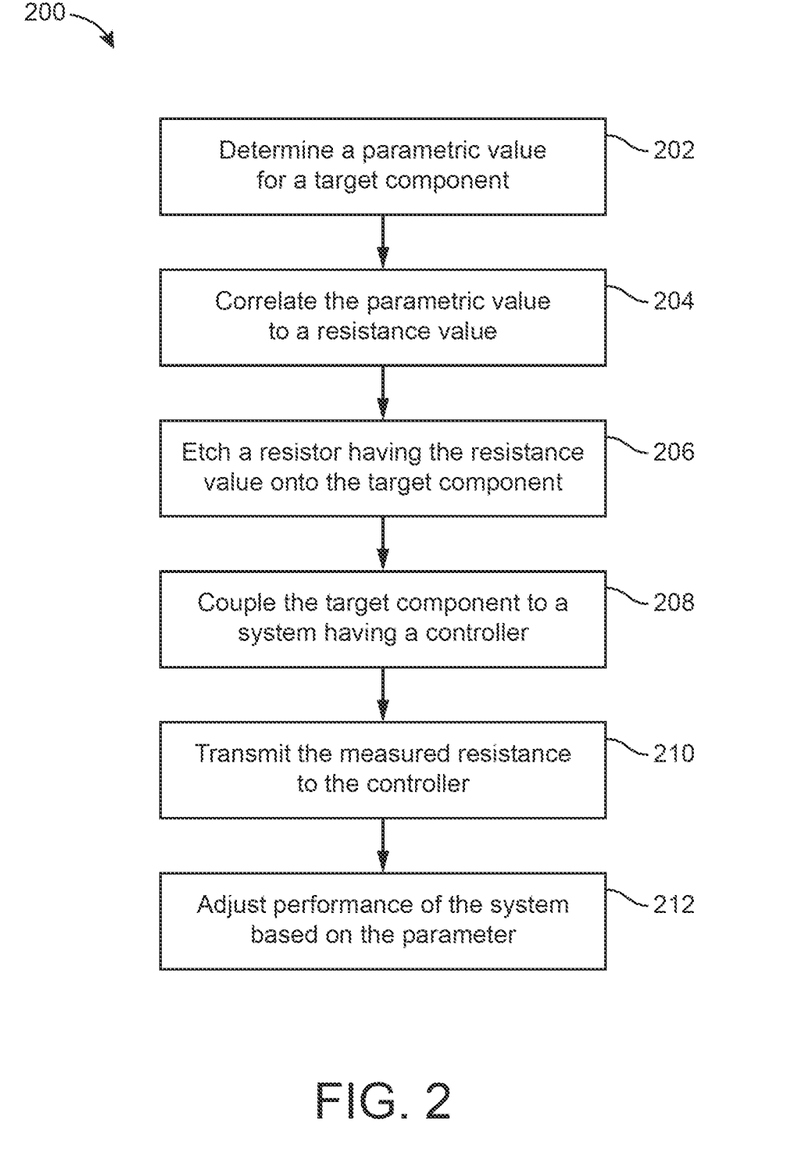
FIG. 2 is a block diagram of an example method of operation of the control system depicted in FIG. 1.

FIG. 2 is a block diagram of a method of operation (a process 200) of a control system (e.g., such as the control system 100 of FIG. 1). The processes of the method 200 are performed by a controller (e.g., such as controller 102). In some embodiments, a central controller (e.g., engine control unit (ECU), engine control module (ECM)) performs the processes of the method 200. The method 200 calibrates the performance of the control system based on a parametric value of a parametric component (e.g., parametric component 104) installed in the control system.

At 202, a parametric value is determined for the parametric component. The parametric value may be any value considered to be important for the control system (e.g., the control system can calibrate for the parametric value). For example, when the parametric component is a valve, the parametric value may be the rate of fluid flowing through the valve over a specified period of time. In another example, when the parametric component is a rack-and-pinion system, the parametric value may identify the supplier of the rack-and-pinion system. In some embodiments, more than one parameter is important for the operation of the parametric component. For example, when the parametric component is an actuator, the traveling bias of the actuator and the response time to an electronic signal are two values important to the control system. In an example embodiment, the parametric value is assigned during the manufacturing of the parametric component. In various embodiments, the parametric value is assigned by a third-party (e.g., a third-party supplier, testing facility).

At 204, a resistance value is correlated (e.g., mapped, assigned) to the parametric value. In an example embodiment, the resistance value is mapped (e.g., assigned) to a specified range of parametric values. For example, a parametric value for a component may be 0.2 seconds. Accordingly, a resistance value of 100 Ohms is mapped to any parametric values ranging between 0.1-0.3 seconds. In another example embodiment, the resistance value that is mapped to the parametric value is linear (e.g., the resistance value increases linearly to the parametric value). For example, a resistance value of 100 Ohms is mapped to a component having a parametric value of 0.1 seconds and a resistance value of 200 Ohms is mapped to a component having a parametric value of 0.2 seconds In various embodiments, the resistance value is correlated to multiple parametric values. The place value of the numerical digit correlates to a different parametric value. For example, when the parametric component is an actuator, the actuator may be biased to travel a longer distance and to respond more quickly to an electronic signal when compared to a nominal actuator. The resistance value correlating to traveling a longer distance may be 3XX Ohms. The resistance value correlating to the response time to the electronic signal may be X50 Ohms. Accordingly, a resistance value of 350 Ohms correlates to an actuator biased to travel a longer distance and that responds more quickly to an electronic signal.

At 206, a resistor having the mapped resistance value is laser etched, embedded, or otherwise applied onto the parametric component. In an example embodiment, the resistor is etched onto a thin film on an internal surface of the parametric component. In another example embodiment, the resistor is laser etched onto a thin film on an external surface of the parametric component.

At 208, the parametric component is coupled to the control system. The control system is configured such that the resistance value of the parametric resistor is determined when the parametric component is coupled to the control system. In an example embodiment, the resistance value is determined using circuitry having a voltage divider configuration (e.g., such as in FIG. 1). In this configuration, the parametric component is electronically coupled to the controller, such that the parametric component provides a voltage the controller. The controller then determines the resistance value using the known values of the other components of the circuit. In another embodiment, the controller receives a signal indicative of the resistance value of the parametric component.

In another example embodiment, when the parametric component is installed by automated machinery, the resistance of the parametric resistor is measured by the automated machinery. The resistance value is then communicated to the control system. In another example embodiment, the resistance value of the parametric resistor is measured manually before or during installation. The resistance value is then input into the controller.

At 210, the controller receives the signal indicative of the resistance value associated with the parametric component. In an example embodiment, the controller receives the signal directly from the parametric component. In other exemplary embodiments, the controller receives the signal from automated machinery or from manual input. The controller then correlates the resistance value to the parametric value of the parametric component. In various embodiments, when the control system is a vehicle, the controller receives the signal at key-on (e.g., when the vehicle is initializing engine operation).

In some embodiments, after receiving the signal indicative of the resistance value associated with the parametric component, the controller determines if the parametric component is a genuine component (e.g., authorized component, original equipment manufacturer (OEM) part, etc.). When the parametric component is a genuine component, the controller proceeds to 212.

When the parametric component is an unauthorized component (e.g., a nongenuine component, counterfeit component, third-party manufacturer part, etc.), the controller may prevent the engine from starting or may send a "check-engine light" signal to the ECU. In other exemplary embodiments, the controller may allow the engine to operate at a limited capacity (e.g., derate the power output of the engine, etc.). This is beneficial as it limits any potential harm caused by the unauthorized component by being installed into the engine or the control system.

In other exemplary embodiments, the controller includes mapping for a list of parametric component makes, models, and/or part numbers. The controller determines whether the parametric component is a white-listed component (e.g., an approved component for use), a grey-listed component (e.g., a component that can be temporarily used), or a black-listed component (e.g., an unauthorized component). When the parametric component is white-listed, the controller is configured to allow the control system to operate under normal operation. When the parametric component is grey-listed, the controller is configured to allow the control system to operate, but under operative limitations. These limitations may include allowing the control system to operate for a limited amount of time, de-rating the control system, and/or sending signals to the ECU. When the parametric component is black-listed, the controller does not allow the control system to operate. This is beneficial as it prevents the control system from being damaged by the unauthorized component.

In other exemplary embodiments, after the controller registers the type of parametric component that is installed into the control system, the controller may store and/or communicate this information. The controller may communicate the type of parametric component that is installed to the manufacturer, a fleet of equivalent control systems, a third-party database, and/or the customer. The information may further include the time of installation of the parametric component and the duration of use of the parametric component. When sharing the information with the manufacturer, the controller may share the information via the cloud and/or at service intervals of the control system.

At 212, the controller calibrates the performance of the parametric component based on the parametric value of the parametric component. In an exemplary embodiment, when the parametric component is manufactured by a specific supplier, the controller can utilize software that corresponds to the components manufactured by that supplier. In other exemplary embodiments, when the parametric component is a specific make, model, and/or part number, the controller can utilize software that corresponds to the specific make, model, and/or part number provided by the supplier. This is beneficial for parts produced by the supplier that have been updated (e.g., upgraded, improved, etc.), which may require a different software to be installed.

In other exemplary embodiments, parametric components may require different a calibration factor applied onto the parametric component based on the region where the parametric component is manufactured and/or the region of use of the parametric component. The controller can determine the region of the supplier of the parametric component and accordingly apply the correct calibration for that region. The controller may also determine the region of use of the control system and accordingly apply the correct calibration for that region of use.

The controller can also calibrate performance of other components in the system based on the parametric value of the parametric component. For example, when the parametric component is a fuel injector that dispenses excess fuel, the controller can calibrate the emissions system by producing excess reductant to treat any additional soot caused by the excess fuel.

Figure 3:
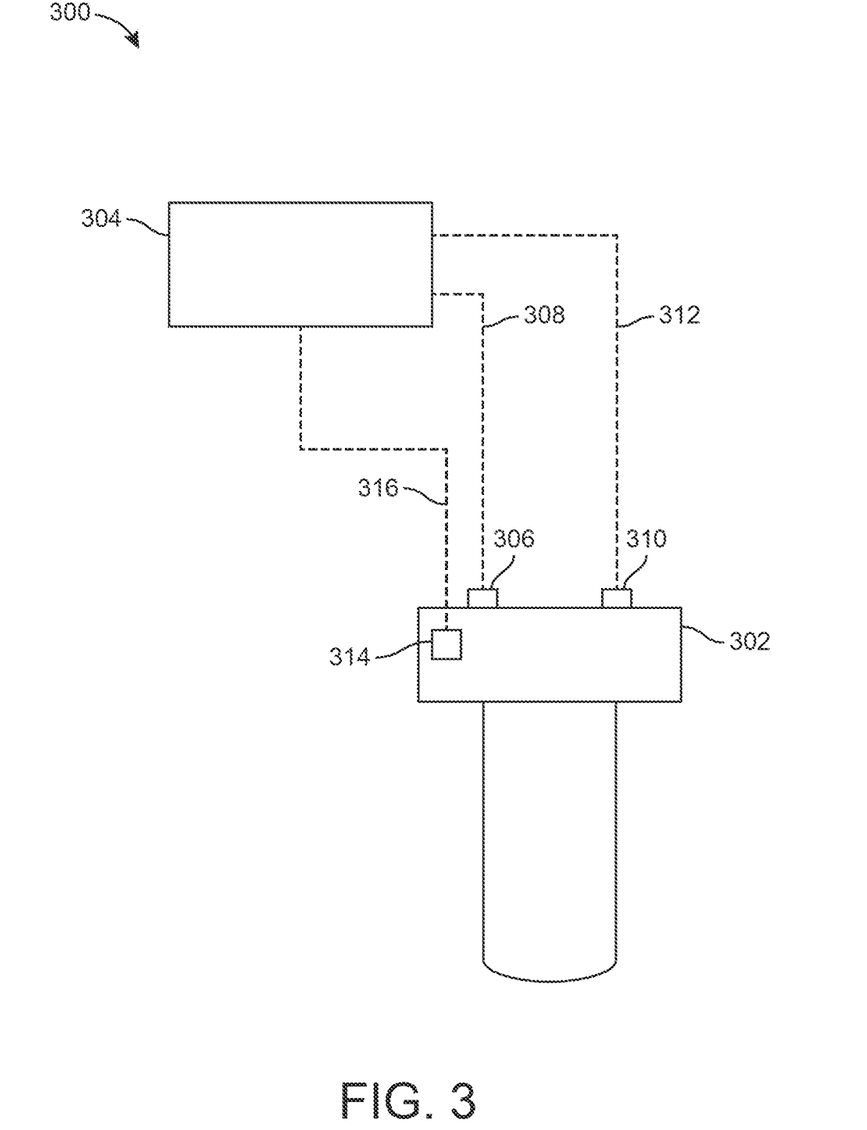
FIG. 3 is a block schematic of a fuel injector in an another example control system.

FIG. 3 is a block schematic of an example control system 300 having a fuel injector 302. The control system 300 includes a controller 304 (e.g., such as the controller 102).

The fuel injector 302 includes a first pin 306 that receives positive power. The first pin 306 is electronically communicable with the controller 304 via a first pin conduit 308 (e.g., electric wire, powered cable, etc.). The fuel injector 302 also includes a second pin 310 that receives negative power. The second pin 310 is electronically communicable with the controller 304 via a second pin conduit 312 (e.g., electric wire, powered cable, etc.). The controller 304 controls the operation of the fuel injector 302 (e.g., the duration of dispensing fuel, etc.) by transmitting and stopping power to the first pin 306 via the first pin conduit 308 and the second pin 310 via the second pin conduit 312.

The fuel injector 302 further includes a resistor 314. In an example embodiment, the resistor 314 is laser etched onto an interior surface of the fuel injector 302. In another example embodiment, the resistor 314 is laser etched onto an exterior surface of the fuel injector 302. The resistor 314 has a resistance value that is mapped to the flow characteristics of that fuel injector 302. Fuel injectors are biased to dispense excess or too little fuel. The flow characteristics of the fuel injector 302 can be dependent on part-to-part variations between fuel injectors and/or on the manufacturer of the fuel injector.

The resistor 314 is electronically communicable with the controller 304 of the control system 300 via a resistor conduit 316 (e.g., electric wire, powered cable, etc.). The resistor conduit 316 is configured to provide a voltage to the controller 304. The controller 304 measures the voltage provided by the resistor conduit 316 and determines the resistance value of the resistor 314 (e.g., via the voltage divider equation 1). The resistance value is mapped to a parametric value of the fuel injector 302. Accordingly, the controller 304 controls the amount of fuel dispensed by calibrating the duration of time power is provided to the first pin 306 and the second pin 310. For example, after mapping the resistance value of the resistor 314 for the fuel injector 302, the controller 304 can determine the fuel injector 302 is biased to dispense less fuel. The controller 304 then calibrates the duration of transmitting power to the first pin 306 and the second pin 310 by a longer duration, so that the desired amount of fuel is dispensed by the fuel injector 302.

In an example embodiment, the controller 304 maps the parametric value when the vehicle is in the ignition phase (e.g., when the vehicle is initializing engine operation). In various embodiments, the controller 304 maps the parametric value when it detects the user entering the vehicle's cabin, the user actuating the brake pedal, the user's proximity to the vehicle (e.g., detect presence of the vehicle's key fob or the user's phone), or when the user initiates a remote start (e.g., through the vehicle's key fob or the user's phone).

Figure 4:
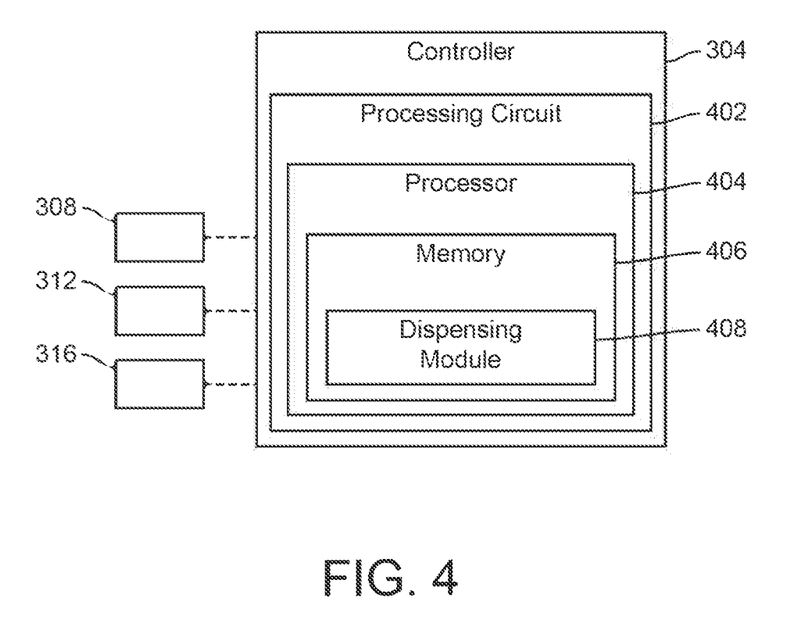
FIG. 4 is a block schematic of an example controller for use in the control system of FIG. 3.

FIG. 4 is a block schematic of an example controller 304 for use in the control system 300 of FIG. 3. The fuel injector 302 is electrically or communicatively coupled to the controller 304. The controller 304 is configured to control the amount of fuel dispensed by the fuel injector 302. The controller 304 includes a processing circuit 402. The processing circuit 402 includes a processor 404 and a memory 406. The processor 404 may include a microprocessor, an application-specific integrated circuit (ASIC), a field-programmable gate array (FPGA), etc., or combinations thereof. The memory 406 may include, but is not limited to, electronic, optical, magnetic, or any other storage or transmission device capable of providing a processor, ASIC, FPGA, etc. with program instructions. This memory 406 may include a memory chip, Electrically Erasable Programmable Read-Only Memory (EEPROM), Erasable Programmable Read Only Memory (EPROM), flash memory, or any other suitable memory from which the controller 304 can read instructions. The instructions may include code from any suitable programming language. The memory 406 may include various modules that include instructions which are configured to be implemented by the processor 404.

The memory 406 includes a fuel dispensing module 408 (e.g., circuit, etc.). The fuel dispensing module 408 is configured to facilitate interaction between the controller 304 and the control system 300. The fuel dispensing module 408 is further configured to determine the dispensing duration of the fuel injector 302. The fuel dispensing module 408 receives a resistance value of the resistor 314 from the resistor conduit 316 indicating the parametric value of the fuel injector 302. The fuel dispensing module 408 then controls operation of the fuel injector 302 by transmitting or stopping power to the first pin 306 via the first pin conduit 308 and to the second pin 310 via the second pin conduit 312.

Figure 5:
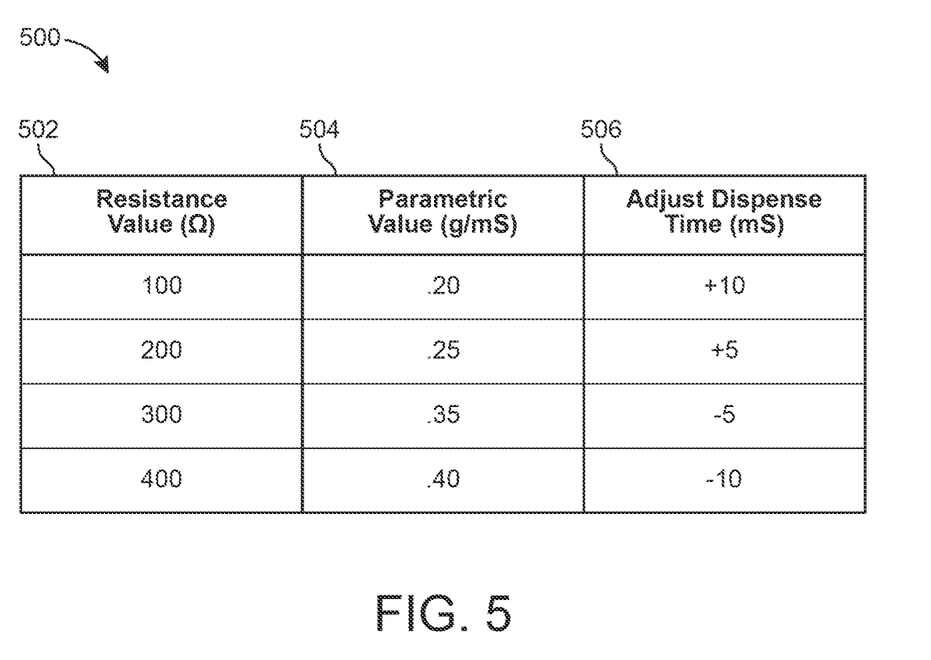
FIG. 5 is a block schematic of an example mapping table for use in the control system of FIG. 3.

FIG. 5 is a block schematic of an example mapping table 500 for the controller 304 of FIG. 3. The resistance value 502 of the fuel injector 302 is determined by reading the voltage provided by the resistor conduit 316. Using the voltage divider equation 1, the controller 304 determines the resistance value 502 of the resistor 314 in Ohms (Ω). The controller 304 maps the resistance value 502 to a parametric value 504. The parametric value 504 is the amount of fuel dispensed per a specified amount of time in grams per millisecond (g/mS). Utilizing the parametric value 504, the controller 304 calibrates a dispensing time 506 in milliseconds (mS). This causes the fuel injector to dispense the desired amount of fuel into an engine's cylinder.

Figure 6:
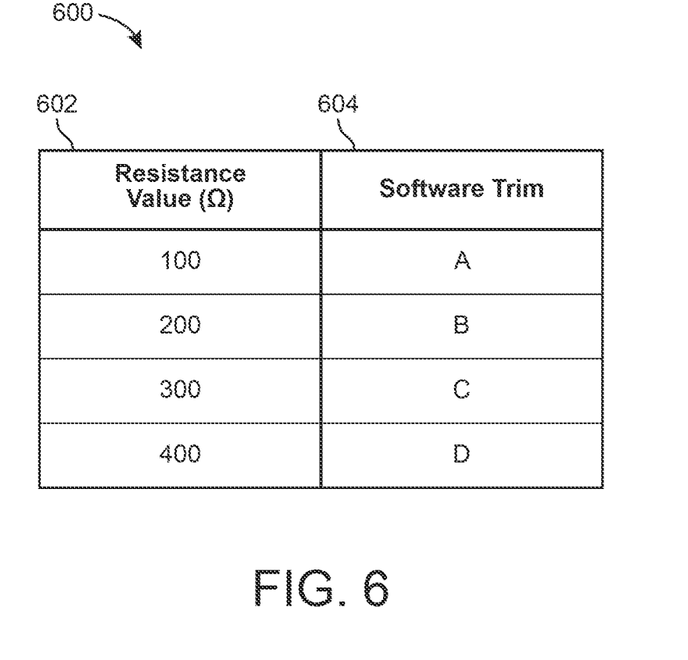
FIG. 6 is a block schematic of another example mapping table for use in the control system of FIG. 3.

FIG. 6 is a block schematic of another example mapping 600 table for the controller 304 of FIG. 3. The resistance value 502 of the fuel injector 302 is determined by reading the voltage provided by the resistor conduit 316. Using the voltage divider equation 1, the controller 304 determines the resistance value 602 of the resistor 314 in Ohms. The controller 304 maps the resistance value 602 to a software trim 604. The software trim 604 is software (e.g., drivers, operating software) used by specific manufactures. For example, when the fuel injector is manufactured by a first supplier, the fuel injector utilizes a software specific to that first supplier. The controller 304 stores the various software trims 604 in the memory 406.

While this specification contains many specific implementation details, these should not be construed as limitations on the scope of what may be claimed but rather as descriptions of features specific to particular implementations. Certain features described in this specification in the context of separate implementations can also be implemented in combination in a single implementation. Conversely, various features described in the context of a single implementation can also be implemented in multiple implementations separately or in any suitable subcombination. Moreover, although features may be described as acting in certain combinations and even initially claimed as such, one or more features from a claimed combination can, in some cases, be excised from the combination, and the claimed combination may be directed to a subcombination or variation of a subcombination.

As utilized herein, the terms "generally," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

The term "coupled" and the like, as used herein, mean the joining of two components directly or indirectly to one another. Such joining may be stationary (e.g., permanent) or moveable (e.g., removable or releasable). Such joining may be achieved with the two components or the two components and any additional intermediate components being integrally formed as a single unitary body with one another, with the two components, or with the two components and any additional intermediate components being attached to one another.

It is important to note that the construction and arrangement of the various systems shown in the various example implementations is illustrative only and not restrictive in character. All changes and modifications that come within the spirit and/or scope of the described implementations are desired to be protected. It should be understood that some features may not be necessary, and implementations lacking the various features may be contemplated as within the scope of the disclosure, the scope being defined by the claims that follow. When the language "a portion" is used, the item can include a portion and/or the entire item unless specifically stated to the contrary.

Also, the term "or" is used, in the context of a list of elements, in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is otherwise understood with the context as used in general to convey that an item, term, etc. may be either X, Y, Z, X and Y, X and Z, Y and Z, or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

What is claimed is:

1. A method of manufacturing a component by a laser etching machine, the method comprising:
    determining a parametric value of the component, the parametric value being a software used in the operation of the component and based upon a manufacturer of the component;
    mapping the parametric value to a resistance value, wherein mapping the parametric value to the resistance value comprises determining a type of the component based on the parametric value; and
    laser etching a resistor having the resistance value onto the component responsive to mapping the parametric value to the resistance value, the resistor being etched into a surface of the component.

2. The method of claim 1, further comprising transmitting an additional signal to an additional component, the additional signal based on a calibration data set, the additional signal configured to calibrate operation of the additional component.

3. The method of claim 1, wherein a controller measures the resistance value of the resistor by comparing a parametric voltage rating to a voltage supply having a known voltage input and a resistor having a known resistance value.

4. The method of claim 1, wherein the surface of the component is an interior surface of the component.

5. The method of claim 1, wherein the surface of the component is an exterior surface of the component.

6. The method of claim 1, wherein the parametric value is associated with at least one of a manufacturer of the component and a model of the component.

7. The method of claim 1, wherein the parametric value is associated with a response time of the component, and further comprising calibrating for the response time when transmitting the signal to the component.

8. The method of claim 1, wherein the parametric value is associated with a rate of fluid flow, and further comprising calibrating an operative duration of the component to calibrate for the rate of fluid flow.

9. The method of claim 1, wherein the laser etching occurs onto a circuit of the component.

10. The method of claim 1, further comprising receiving a signal indicating the parametric value from an auxiliary controller.

11. The method of claim 1, wherein the component is one of: a fuel injector, an actuator, a turbine, a rack-and-pinion, a throttle, a turbocharger, a glow plug, a heater, a pump, an alternator, a spark plug, a thermostat, a motor, a generator, a battery, a fan, or an electric axle.

12. The method of claim 1, further comprising determining a region based on the parametric value, the region being at least one of: where the component was manufactured, or where the component is intended to be used.

13. The method of claim 1, wherein determining the type of the parametric component comprises determining at least one of a brand of the component or a model of the component, based on the parametric value.

14. The method of claim 1, further comprising laser etching the parametric resistor onto a film on one of: an exterior surface of the component or an interior surface of the component.

15. A method for calibrating a control system by a controller, the method comprising:
receiving a current from a component of the control system, the component communicatively coupled to the controller, the component having a parametric resistor with a resistance value;
determining the resistance value of the parametric resistor by measuring a parametric voltage rating of the current;
mapping the resistance value to a parametric value associated with the component;
generating a calibration data set, the calibration data set based on calibrating the control system to calibrate for the parametric value; and
transmitting a signal to the component, the signal based on the calibration data set, the signal configured to calibrate operation of the component;
wherein the parametric value is associated with a traveling bias of the component, and further comprising calibrating a distance traveled by the component to calibrate for the traveling bias.

* * * * *